(12) United States Patent
Illiberi et al.

(10) Patent No.: US 9,251,935 B2
(45) Date of Patent: Feb. 2, 2016

(54) METHOD OF MAKING A TRANSPARENT METAL OXIDE ELECTRODE

(71) Applicant: Nederlandse Organisatie voor toegepast-natuurwetenschappelijk onderzoek TNO, Delft (NL)

(72) Inventors: Andrea Illiberi, Delft (NL); Frank Theodoor Johannes Grob, Delft (NL); Paulus Willibrordus George Poodt, Delft (NL); Gerardus Johan Jozef Winands, Delft (NL); Pieter Jan Bolt, Delft (NL)

(73) Assignee: Nederlandse Organisatie voor toegepast-natuurwetenschappelijk onderzoek TNO (NL)

( * ) Notice: Subject to any disclaimer, the term of this patent is extended or adjusted under 35 U.S.C. 154(b) by 0 days.

(21) Appl. No.: 14/399,849

(22) PCT Filed: May 8, 2013

(86) PCT No.: PCT/NL2013/050346
§ 371 (c)(1),
(2) Date: Nov. 7, 2014

(87) PCT Pub. No.: WO2013/169106
PCT Pub. Date: Nov. 14, 2013

(65) Prior Publication Data
US 2015/0099325 A1 Apr. 9, 2015

(30) Foreign Application Priority Data

May 8, 2012 (EP) .................................. 12167102

(51) Int. Cl.
*H01L 21/44* (2006.01)
*H01B 13/00* (2006.01)
(Continued)

(52) U.S. Cl.
CPC ............... *H01B 13/003* (2013.01); *C09C 1/00* (2013.01); *C09C 1/043* (2013.01); *C09C 3/063* (2013.01); *H01B 1/08* (2013.01); *H01B 13/0016* (2013.01); *H01B 13/22* (2013.01); *H01L 31/03923* (2013.01); *H01L 31/18* (2013.01)

(58) Field of Classification Search
CPC ................. H01L 2224/48091; H01L 2924/00; H01L 2924/00014; H01L 51/56; H01L 2224/45144; H01L 2924/0002; H01L 2924/01322; H01L 2924/12041; H01L 2924/1461; H01L 2924/3025; H01L 51/0064; H01L 51/5203
USPC .............. 257/43, 77, 414, 431, 749, E29.094, 257/E23.011; 438/105, 104
See application file for complete search history.

(56) References Cited

FOREIGN PATENT DOCUMENTS

DE 199 51 207 A1 * 4/2001 .......... H01L 31/0256
DE 19951207 A1 4/2001
(Continued)

OTHER PUBLICATIONS

Akira, Yamada, et al., "Mobility Enhancement of textured ZnO Films by Ultaviolet Light Irradiation", Japanese Journal of Applied Physics 30, (May 1, 1991), L 1152-L1154.
(Continued)

*Primary Examiner* — Mark A Laurenzi
(74) *Attorney, Agent, or Firm* — Schwegman Lundberg & Woessner, P.A.

(57) ABSTRACT

The present invention relates to a method for enhancing the conductivity of an undoped transparent metal oxide to obtain a transparent conductive oxide (TCO) electrode. More in particular it relates to such a method comprising the steps of providing a transparent metal oxide, applying a UV transparent barrier layer on the transparent metal oxide, and irradiating the transparent metal oxide with UV radiation after applying the barrier layer.

19 Claims, 8 Drawing Sheets

(51) Int. Cl.
*C09C 3/06* (2006.01)
*C09C 1/00* (2006.01)
*C09C 1/04* (2006.01)
*H01B 1/08* (2006.01)
*H01B 13/22* (2006.01)
*H01L 31/0392* (2006.01)
*H01L 31/18* (2006.01)

(56) References Cited

FOREIGN PATENT DOCUMENTS

| JP | 2005099536 A | 4/2005 |
|---|---|---|
| WO | WO-2011101338 A2 | 8/2011 |
| WO | WO-2013169106 A1 | 11/2013 |

OTHER PUBLICATIONS

Battaglia, Corsin, et al., "Light Trapping in Solar Cells: Can Periodic Beat Random?", ACSNANO 6(3), (2012), 2790-2797.

Corsin, Battaglia, et al., "Nanomoulding of transparent zinc oxide electrodes for efficient light trapping in solar cells", nature photonics 5, (2011), 535-538.

Exarhos, Gregory, et al., "Discovery-based design of transparent conduction oxide films", Thin Solid Films 515, (Mar. 16, 2007), 7025-7052.

Lim, S. L, et al., "The Effects of UV Exposure on Plasma-Enhanced Atomic Layer Deposition ZnO Thin Film Transistor", Electrochemical and Solid-State Letters 13(5), (2010), H 151-H 154.

Ohta, Hiromichi, et al., "Transparent oxide optoelectronics", Materials Today (Jun. 2004), 42-51.

Takurou, Murakami N, et al., "Low temperature preparation of mesoporous TiO2 films for efficient dye-sensitized photoelcetrode by checmical vapor deposition combined with UV light irradiation", Journal of Photochemistry and Photobiology A: Chemistry 164, (2004), 187-191.

"International Application Serial No. PCT/NL2013/050346, International Preliminary Report on Patentability Nov. 11, 2014", 5 pgs.

"International Application Serial No. PCT/NL2013/050346, International Search Report Jul. 23, 2013", 3 pgs.

"International Application Serial No. PCT/NL2013/050346, Written Opinion Jul. 23, 2013", 4 pgs.

Olivier, J., et al., "Stability/instability of conductivity and work function changes of ITO thin films, UV-irradiated in air or vacuum: Measurements by the four-probe method and by Kelvin force microscopy", Synthetic Metals 122(1), 87-89.

* cited by examiner

METHOD OF MAKING A TRANSPARENT METAL OXIDE ELECTRODE

PRIORITY APPLICATIONS

This application is a U.S. National Stage Filing under 35 U.S.C. 371 from International Application No. PCT/NL2013/050346, filed on 8 May 2013, and published as WO/2013/169106 A1 on 14 Nov. 2013, which claims the benefit to EP Application No. 12167102.8, filed on 8 May 2012; which applications and publication are incorporated herein by reference in their entirety.

The present invention relates to a method of making a transparent metal oxide electrode. More in particular it relates to such a method comprising the steps of providing the transparent metal oxide and applying a barrier layer on the transparent metal oxide.

STATE OF THE ART

Transparent conductive oxides (TCOs) are metal oxides that combine transparency for visible and near infrared light with a relatively good electrical conductivity. For this reason TCOs are used as an electrode in electronic and electrical devices, i.e. so that external electrical contact to the TCO is possible for use in the operation of the device, where such an electrode must be optically transparent. Transparent conductive electrodes are being used in for example light emitting devices, (flat panel) displays, photovoltaic cells, and smart glasses.

A well-known and widely used transparent conductive oxide is indium tin oxide (ITO). ITO is being used in for example amorphous or (semi-)crystalline silicon solar cells. A promising alternative for ITO is zinc oxide (ZnO).

Transparent conductive oxide layers can be obtained by doping a transparent metal oxide. Doping is a process wherein small amounts of specific impurities are introduced in a semiconductor to increase its conductivity. Transparent conductive oxides obtained by doping a transparent metal oxide are used in solar cells, displays, smart glasses, and light emitting diodes (LEDs) because of their good electrical and optical properties, viz. because they combine high conductivity and transparency. Typical dopants used for transparent conductive oxides are gallium, aluminium, indium, boron, and fluorine. To make for example zinc oxide conductive, this metal oxide can be doped with aluminium. Aluminium is at present the most investigated and best known dopant for ZnO. Doped zinc oxide can be deposited as a thin layer on a substrate by several processes including chemical vapour deposition (CVD).

Besides by doping, the poor electrical conductivity of transparent metal oxides can be improved by selecting a proper fabrication technique, for example deposition of non-stoichiometric zinc oxide. Also post-deposition treatments such as exposure to hydrogen atmosphere and/or plasma of the deposited layer are used to make undoped transparent metal oxides conductive. In addition, the conductivity of a transparent metal oxide as fabricated, therefore the undoped metal oxide, can be improved by, for example, exposure to ultraviolet (UV) light. The conductivity of zinc oxide can be increased by exposure to light with an energy above the zinc oxide band gap (about 3.4 eV), i.e. UV radiation (having a wavelength between about 10 nm and about 400 nm) and near-UV (having a wavelength between about 300 nm and about 400 nm) It is assumed that the UV radiation induces shallow donor defects in the material, thus increasing the conductivity. Unfortunately, these light-induced defects are not stable in time and the conductivity of the zinc oxide reduces to its initial low value after removing the light source.

Undoped transparent metal oxides are used as UV sensors because they do absorb UV radiation, although they are transparent to visible light. See e.g. Ohta & Hosono [Hiromichi Ohta and Hideo Hosono, Transparent oxide optoelectronics, Materialstoday, June 2004, pp. 42-51]. Although such metal oxide layers are suitable for UV sensors, they cannot be used in devices that require a high conductivity of the metal oxide for a long time, such as electrodes of photovoltaic cells and thin film transistors.

Transparent metal oxide layers can be used to obtain an antireflection film that does not deteriorate when subjected to UV radiation. See e.g. Japanese patent application JP2005-099536.

A description of electronic conductivity in transparent metal oxide systems can be found in Exarhos et al. [Gregory J. Exarhos and Xiao-Dong Zhou, Discovery-based design of transparent conducting oxide films, Thin Solid Films, 515 (2007), pp. 7052-7052.

Lim et al. [S. J. Lim, Jae-Min Kim, Doyoung Kim, Changsoo Lee, Jin-Seong Park and Hyungjun Kim, The Effects of UV Exposure on Plasma-Enhanced Atomic Layer Deposition ZnO Thin Film Transistor, Electrochemical and Solid State Letters 13 (5) H151-H154 (2010)] studied the effect of UV exposure on the electrical properties of zinc oxide. In the method described by Lim et al. a ZnO layer deposited by plasma-enhanced atomic layer deposition (PE-ALD) is exposed to UV radiation in a vacuum environment. The ZnO layer is subsequently, viz. after removing the UV radiation, coated with an aluminium oxide ($Al_2O_3$) film having a thickness of 20 nm. This coating results in an improved stability of the photo-enhanced photoconductivity in the ZnO layer up to a period of several months after the UV exposure.

International patent application WO/2011/101338 discloses a method for making a transparent electrode comprising a transparent conductive oxide for, for example, optoelectronic applications. To reduce the loss of transparency of the TCO, for example aluminium doped zinc oxide, the TCO is covered by a protective oxide layer.

SUMMARY OF THE INVENTION

An objective of the present invention is to provide a method of making a transparent conductive oxide electrode having a high conductivity during a long time.

This objective of the invention is obtained by a method of making a transparent metal oxide electrode comprising the steps of:
  providing a transparent metal oxide,
  applying a barrier layer on the transparent metal oxide, characterised in that
  the barrier layer is substantially UV transparent, and in that the method comprises the step of irradiating the transparent metal oxide with UV radiation (14),
  wherein the barrier layer is applied before irradiating the transparent metal oxide, such that the UV radiation is provided to the transparent metal oxide through the UV transparent barrier layer.

An advantage of providing the UV radiation through the barrier layer to the transparent metal oxide of the electrode is that there is no time period during which the UV exposed transparent metal oxide, thus the transparent conductive oxide (TCO) obtained by the exposure, is not covered by the barrier layer.

An effect of the absence of such a period during which the TCO is not covered by the barrier layer is that the TCO will not be subject to degradation processes which are caused by for example oxygen, water vapour, or the thermal load before and during the deposition of the barrier layer. Another effect of the absence of a period during which the TCO is not covered by the UV transparent barrier layer is that the UV treatment of the transparent metal oxide needs not to be performed in vacuum or in a specific protective atmosphere like nitrogen.

Consequently, the decrease of the conductivity of the TCO during the processing, storage, or use of the metal oxide is prevented and the TCO will maintain a high conductivity as of the moment of exposure to the UV radiation during a long time thereafter. The high conductivity will be maintained after removal of the UV radiation.

For example, the transparent metal oxide may be irradiated with UV radiation by means of a UV source, the transparent metal oxide with the barrier layer on it being placed in relation to the UV source as to allow the UV light to reach the transparent metal oxide layer after passing the barrier layer. This results in an increase in conductivity that lasts after the irradiation. An increase that reduces square resistance to below 100 Ohm/square and more preferably to below 20 Ohm/square may be realized. The size of the increase in the irradiation depends on the materials used and the circumstances of irradiation, and can be increased by increasing the time period of irradiation. A time period that results in a desired increase may be selected for example by measuring the electrical conductivity of metal oxide layers after irradiation under given circumstances of irradiation for a number of different time periods.

A top electrical contact may be provided on a part of the transparent metal oxide to provide external electrical contact to the electrode. In a further embodiment, the top electrical contact extends through the barrier layer to provide external electrical contact. Alternatively, the barrier layer may cover the top electrical contact as well.

DETAILED DESCRIPTION OF EXEMPLARY EMBODIMENTS

It is well established that several transparent metal oxides can be made electrically conductive by doping to a level that allows the application of such materials in electrodes that need to be transparent for visible light. Examples of such doped transparent metal oxides are fluorine doped tin oxide and aluminium doped zinc oxide. However, it has been shown that the conductivity of such metal oxides can also be improved by for example a hydrogen plasma treatment or irradiation with UV light. The invention relates to improving the conductivity of transparent metal oxides by UV radiation. The process that results in the enhanced conductivity of the metal oxides seems not to be understood completely and the inventors do not wish to be bound to any theory.

Figure 1:
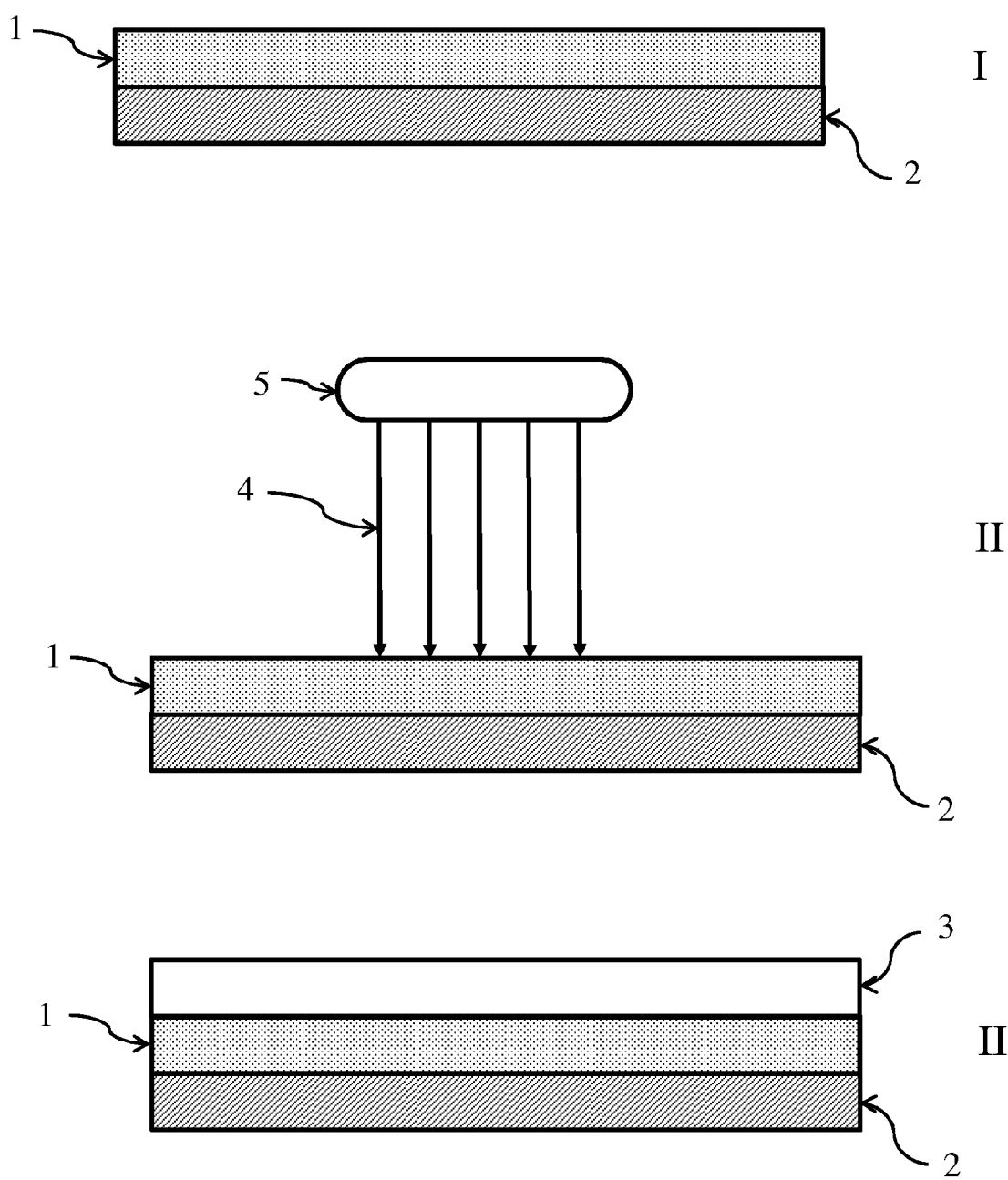
FIG. 1 schematic drawing of a method for enhancing the conductivity of a transparent metal oxide layer according to the state of the art.

In FIG. 1 a method for enhancing the electrical conductivity of a transparent metal oxide according to the state of the art is shown schematically. This is the method as described by Lim et al. for improving the electrical properties of a zinc oxide layer for use in a thin film transistor. As a first step (indicated with "I"), the zinc oxide layer (1) is deposited onto a carrier (2). Subsequently (indicated with "II"), the zinc oxide layer is exposed to UV radiation (4) in a vacuum system comprising an UV lamp (5). In a third step of the method (indicated with "III"), a so-called passivation layer (3) of aluminium oxide is deposited onto the transparent conductive zinc oxide.

Figure 2:
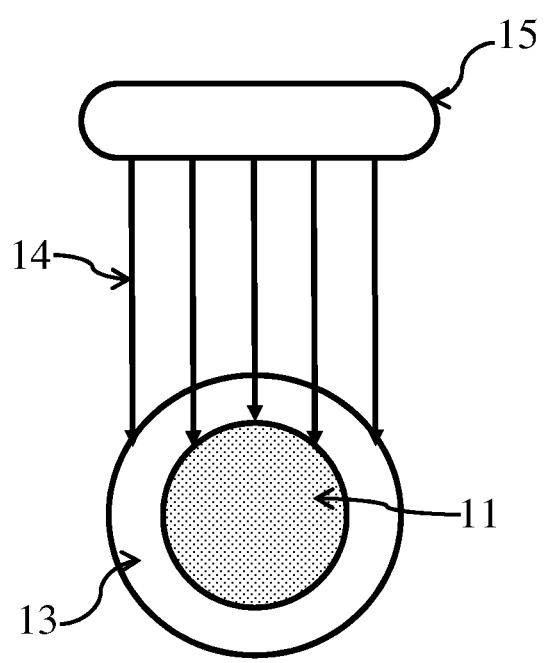
FIG. 2 schematic drawing of an embodiment of a method for enhancing the conductivity of a transparent metal oxide.

An embodiment of the method for improving the conductivity of a transparent metal oxide is shown schematically in FIG. 2. In this embodiment a barrier layer (13) that is substantially transparent for UV radiation is applied on a particle comprising a transparent metal oxide (11). Those skilled in the art are familiar with coating and deposition techniques to apply such layers to particles and substrates. These techniques include among many others, depositing a shell around particles by using a fluidized bed of metal oxide particles or depositing barriers on substrates. After encapsulating the metal oxide particle with the barrier layer, the particle is irradiated with UV radiation (14). This UV radiation can be provided by any type of UV source (15) emitting a proper wavelength.

The method for improving the conductivity of a transparent metal oxide will be described in more detail with reference to the embodiment shown schematically in FIG. 3.

According to this embodiment of the method, a multilayer comprising a carrier (12), a transparent metal oxide layer (11) and an UV transparent barrier layer (13) is exposed to UV radiation (14). The UV source (15) can be any lamp or light-emitting device providing UV light, viz. electromagnetic radiation with a wavelength between 10 nm and 400 nm, preferably between 200 nm and 400 nm Examples of such UV sources are mercury lamps, UV emitting lasers, argon lamps, and iron lamps. The UV transparent barrier layer should be transparent for at least a part of the UV spectrum emitted by the UV source. Preferably, the barrier layer is substantially transparent for a part of the spectrum that corresponds to energy levels higher than the band gap of the transparent conductive oxide, so for wavelengths (lambda) larger than $(h \times 2\pi f)/E$, where h is the Planck constant, f the frequency, and E the band gap.

The multilayer (10) in which the transparent metal oxide layer is sandwiched between the barrier layer and the carrier layer or substrate, is placed in the vicinity of the UV source as to allow the UV light to reach the transparent metal oxide layer after passing the UV transparent barrier. In this embodiment the UV light is provided from one side of the metal oxide layer. However, in case that the carrier or substrate is also UV transparent, the UV radiation can be applied from two sides, viz. the upper and lower side in FIG. 3. Typically, the time period for UV radiation is in the order of minutes or less for example 3, 5 or 10 minutes. However, the period may be tens of minutes or even a few hours. The optimum time period can be determined experimentally and depends on the type of metal oxide and the equipment used. After a suitable time period has been determined, for example by measuring the electrical conductivity of metal oxide layers after irradiation under different conditions, this predetermined time period can be used for enhancing the conductivity of the transparent metal oxide. It is appreciated that the effect of the UV irradiation may be enhanced or accelerated by heating the metal oxide up to temperatures above room temperature during the UV irradiation.

It is known that an exposure of a transparent metal oxide to UV radiation may result in a transparent conductive metal oxide and that such a better conductivity of the metal oxide can be maintained during some time when the transparent conductive oxide layer is covered with a layer after being exposed to UV. The inventors, however, have found that the metal oxide layer can also be exposed to UV radiation after the barrier layer has been applied, provided that the barrier has the proper characteristics. More in particular, the barrier should be transparent for UV light. Whereas according to the state of the art, layers with the proper characteristics are applied after or on top of each other, the inventors realised that it is also possible to make the metal oxide conductive later, during processing. More in particular they realised that an UV exposure after applying the barrier layer on the metal oxide has several advantages compared to providing the barrier after such an UV exposure.

Because the barrier is already present at the moment that the metal oxide is made conductive by UV irradiation, the obtained transparent conductive oxide layer will not be exposed to a conductivity-degrading environment like atmospheric air comprising oxygen and water. Deposition of the barrier layer after the UV exposure may reduce the conductivity of the transparent conductive oxide layer, for example because of the high temperatures that accompany the deposition of the barrier onto the transparent conductive layer or because of the use of water or oxygen as precursor for the deposition of the barrier. The inventors realised that by applying the barrier layer before UV exposure, such degradation will be strongly reduced or will not take place at all during long time.

It seems to be possible to limit the reduction of the conductivity between the UV exposure and the application of the barrier layer by performing the UV exposure and the subsequent deposition of the barrier layer in vacuum. However, applying such a method in vacuum will not prevent the deterioration of the transparent conductive oxide layer because of the use of water or oxygen, more in particular ozone, as precursor. Further, such a process requires huge investment in vacuum equipment. Further, the processing and handling of the devices for which the TCO is used, is complex in case that certain steps have to performed in vacuum, thus increasing the risks of malfunction.

The UV transparent barrier layer (13) can be any type of layer that permits UV radiation passing the barrier layer while preventing or at least hindering water vapour or gas, in particular oxygen, entering into the transparent conductive layer. Preferred barrier layers are materials that have a low absorption of UV radiation, such as glass, silicon oxide, aluminium oxide and indium zinc oxide (InZnO). For many applications like for example photovoltaic cells the barrier has to be a dielectric, viz. a non-conductive material. This class of materials not only includes glass, silicon oxide and aluminium oxide but also polymeric materials such as for example polyesters like polyethylene terephthalate (PET).

It will be appreciated that although the substantially UV transparent barrier layer is applied on the transparent metal oxide, the transparent conductive metal oxide need not to be encapsulated completely by the UV transparent barrier layer, provided that the UV radiation can reach the metal oxide. As shown in the embodiment of FIG. 3, one side of the metal oxide layer is covered by the carrier, which carrier provides protection against degradation and thus also acts as a barrier. In such an embodiment the transparent metal oxide is only partially covered by the UV transparent barrier.

Figure 3:
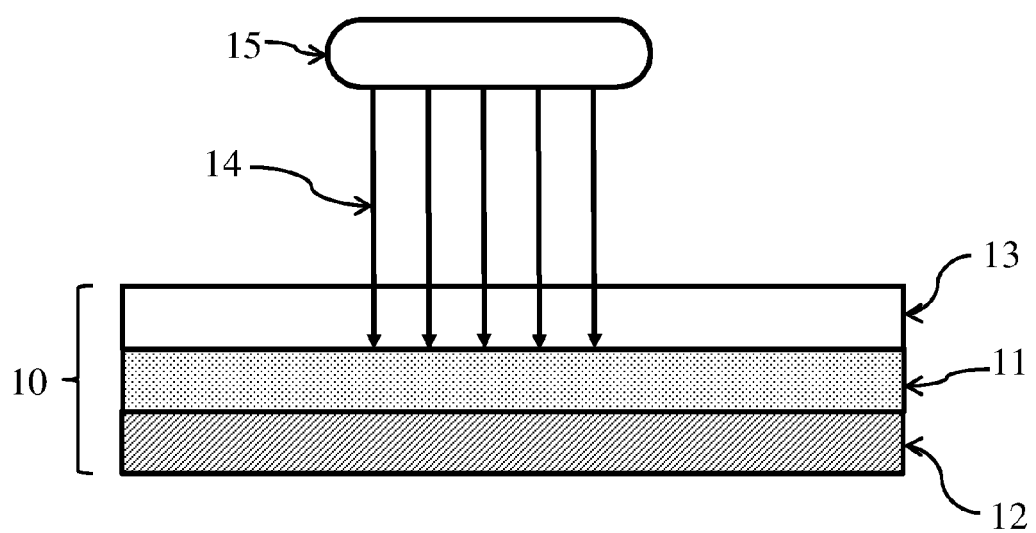
FIG. 3 schematic drawing of an embodiment of a method for enhancing the conductivity of a transparent metal oxide layer.

FIG. 3 is not drawn on scale, neither with respect to the thickness of the layers nor with respect to the ratio between thickness and lateral dimensions. In particular, the relative thickness of the three layers might be different. In practise for example, the carrier layer might have a thickness even in the order of millimeters, whereas the other two layers might have a thickness in the order of micrometers or even nanometers.

Figure 4:
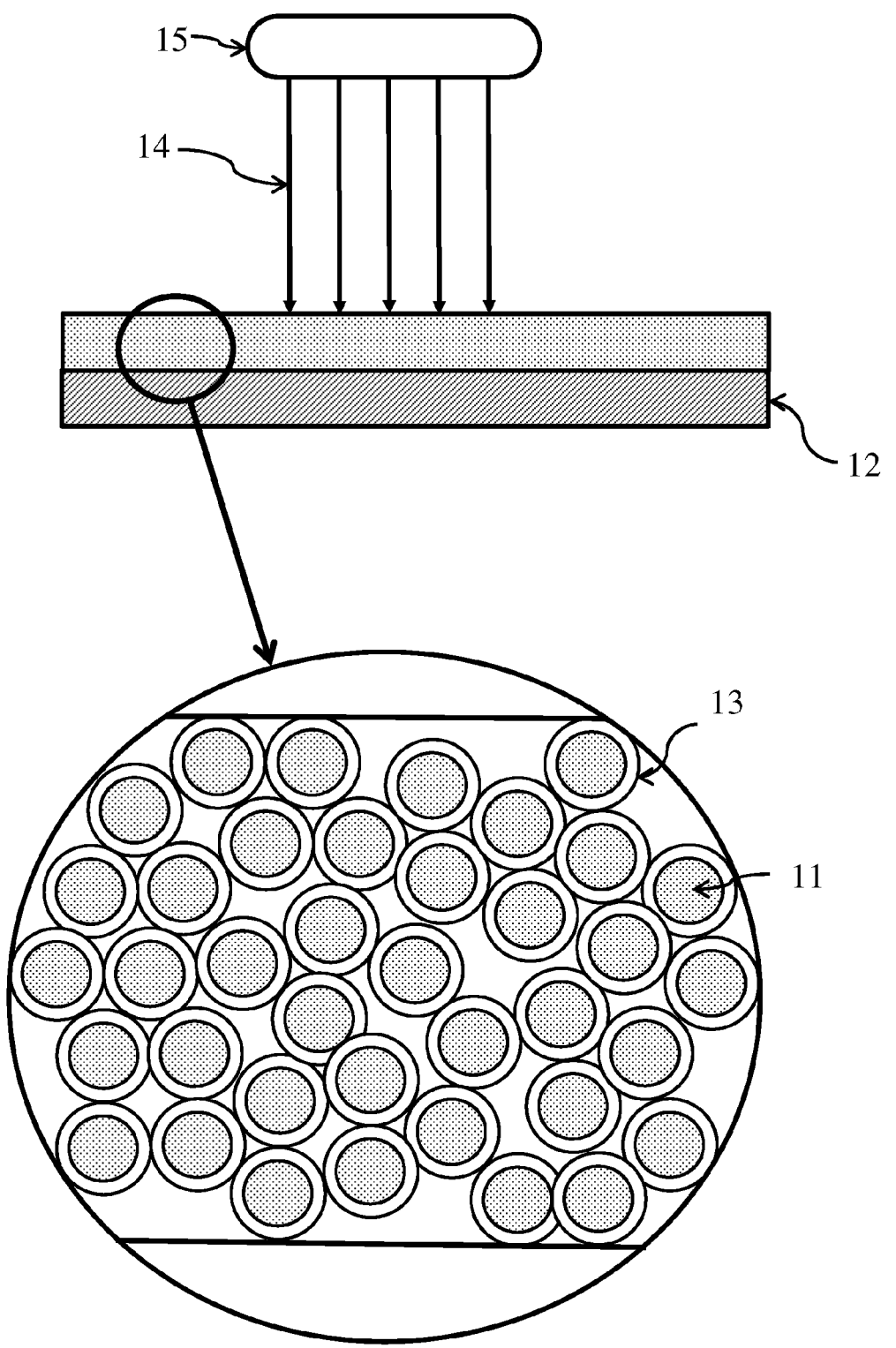
FIG. 4 schematic drawing of another embodiment of a method for enhancing the conductivity of a transparent metal oxide layer.

The embodiment as shown in FIG. 3 comprises a barrier layer covering a layer comprising the transparent metal oxide. The metal oxide layer might comprise metal oxide particles encapsulated by a UV transparent barrier layer as shown in FIG. 2. Of course, to obtain a conductive layer comprising encapsulated particles, the shell needs to be sufficiently thin to allow electrical current passing the shell from one metal oxide core to another core. Typically such a shell will have a thickness of a few nanometers. An embodiment comprising metal oxide particles is shown in FIG. 4. A layer comprising metal oxide particles (11) coated with a barrier (13) may not have to be covered with an additional barrier layer because the substantially UV transparent barrier layer forming the shell provides a barrier against degradation of the transparent metal oxide. However, applying an additional barrier layer on top of such a layer, might improve the stability of the transparent conductive layer in particular if the thin shell around the particles does not provide a good barrier against degradation.

In FIGS. 3 and 4, the carrier layer (12) is shown as a single layer. The word carrier is used for any substrate suitable for carrying a transparent oxide and a barrier. The carrier may comprise one or more layers providing as a stack certain mechanical support. In particular the carrier may comprise a semiconductor layer of a transistor or solar cell, an electrode, and a mechanical support layer like for example a glass, polymeric or ceramic substrate, a wafer, or a flexible foil. In photovoltaic cells, the carrier may for example comprise amorphous or (semi-) crystalline silicon or copper indium gallium selenium (CIGS)

The transparent metal oxide (13) may be any oxide in the class of materials that is suitable to obtain a transparent conductive oxide. This class of materials comprises among others zinc oxide (ZnO), tin oxide ($SnO_2$), cadmium oxide (CdO), and indium oxide ($In_2O_3$). The transparent conductive oxide can be applied onto the carrier by deposition techniques like spatial atomic layer deposition, electron beam evaporation, activated plasma deposition, (RF-) sputtering, metal-organic chemical vapour deposition (MOCVD), sol-gel processes, pulsed laser deposition, atmospheric plasma enhanced chemical vapour deposition (APCVD), expanding thermal plasma chemical vapour deposition (ETP CVD), and spray pyrolysis. Because the layers usually are very thin, such deposition techniques will be preferred for applying the transparent conductive layer and the barrier layer. In such an embodiment the transparent metal oxide might be deposited on a carrier before applying the barrier on the metal oxide. However, when handling allows, the layers may also be combined by, for example, a lamination process. Although in practise the transparent metal oxide layer will be deposited onto the carrier, a reverse order might also be suitable. The transparent conductive layer may be applied onto the UV transparent barrier before the carrier is attached to the transparent conductive layer.

A preferred transparent metal oxide to obtain a TCO according to the method is zinc oxide because ZnO combines high conductivity and excellent transparency with low costs, low toxicity, and easy fabrication and patterning. Further, ZnO is stable in a hydrogen environment which might be used for example for the deposition of an amorphous/microcrystalline silicon thin layer.

It has been observed that the electrical resistivity of a ZnO layer at room temperature can be reduced, so the conductivity can be increased if the layer is heated up to a temperature higher than room temperature during providing the UV radiation. So typically to a temperature that is higher than 20° C.

A preferred UV transparent barrier is aluminium oxide because $Al_2O_3$ combines the required transparency for UV light with an excellent barrier against moisture.

To be effective, the UV radiation preferably comprises wavelengths that are smaller than the wavelength that corresponds to the band gap of the transparent metal oxide. The wavelength that corresponds to the band gap of zinc oxide, which band gap is about 3.4 eV, is about 365 nm. Therefore, a UV source with a spectrum that comprises a wavelength in the range between 300 nm and 400 nm is preferred in case that the barrier layer comprises ZnO.

An advantageous deposition technique for zinc oxide is spatial atomic layer deposition (ALD). An even more preferred deposition technique is Plasma Enhanced Chemical Vapour Deposition (PECVD) at atmospheric pressure because this technique allows the deposition of the oxide at low temperature (lower than 250° C.). The low temperature allows the use of carrier materials like polymers. Polymers have many advantages like low costs and mechanical flexibility. However, polymers combine these positive properties with a relative poor resistance to the high temperatures (380° C. to 550° C.) of deposition techniques like chemical vapour deposition, which is a technique applied for the deposition of aluminium doped zinc oxide at atmospheric pressure. Moreover, PECVD can achieve high deposition rates (7 nm/s) and it is suitable for large area deposition, i.e. high throughput deposition method. The absence of a vacuum system contributes to a low cost production.

A preferred deposition technique for a barrier layer comprising aluminium oxide is spatial Atomic Layer Deposition (ALD). One of the advantages of this technique for the deposition of the aluminium oxide layer is that a high deposition rate can be achieved (up to 3 nm/s) while keeping the advantages of the ALD method: growth of uniform, pinhole free and highly conformal thin layers on large areas and flexible substrates. Moreover, the spatial ALD may be performed at atmospheric pressure.

The inventors surprisingly found that the method allows the fabrication of devices comprising a transparent conductive oxide layer having a high conductivity, viz. having a low square resistance, when undoped zinc oxide is used. In particular they have found that the square resistance of the transparent conductive oxide layer obtained by the method comprising undoped zinc oxide can be lower than 100 Ohm/sq. The resistivity of the irradiated zinc oxide is typically the order of $10^{-4}$ to $10^{-3}$ Ohm-cm. An advantage of such a low electrical resistance is that it allows for example photocurrent collection with low Ohmic losses in photovoltaic cells.

Further the inventors have found that the high electrical conductivity of the metal oxide can be combined with a high optical transparency, viz. a high transparency for visible light. They have found that the optical transparency can be higher than 85%.

Figure 5:
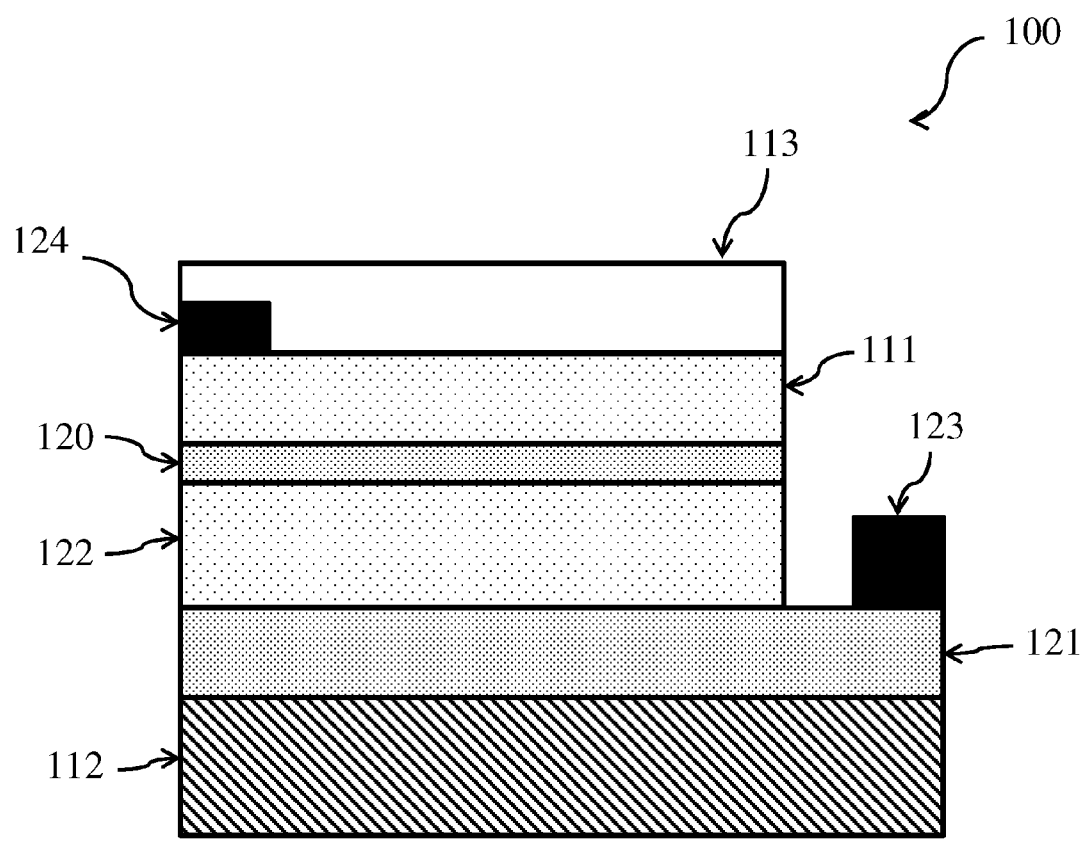
FIG. 5 schematic drawing of an embodiment of a device comprising a transparent conductive oxide layer.

A schematic drawing of an embodiment of a device comprising a conductive metal oxide layer and a barrier is shown in FIG. 5. This particular device is a photovoltaic cell (100) of the CIGS type. In this type of solar cell the light absorbing semiconductor (122) is a p-doped copper indium gallium selenium. An undoped transparent conductive ZnO layer (111) provides an electrode of the photovoltaic cell. External electrical contact to this upper electrode is made by a top electrical contact (124). The transparent conductive oxide layer is covered by a barrier layer (113) of aluminium oxide. In this particular embodiment the barrier covers also the top electrical contact. However, the top electrode might extend through the barrier layer upwards to allow easier electrical contact from the upper side of the device. The photovoltaic cell further comprises a glass substrate (112) for carrying the stack of thin layers.

The multilayer device comprises a thin buffer layer (120) made of cadmium sulphide (CdS) layer, which buffer layer is situated between the ZnO layer (111) and the CIGS-layer (122). A reflective molybdenum (Mo) layer (121) serves as a second electrode for the photovoltaic cell. A bottom electrical contact (123) allows external electrical contact for providing the generated electrical current to the outside world.

In another embodiment of the device, the ZnO layer (11) and the barrier layer (13) might be combined in a single layer comprising ZnO particles encapsulated by the barrier as indicated in FIG. 4.

EXAMPLE

Zinc oxide layers with a thickness from 200 to 1200 nm where deposited on glass by a plasma enhanced chemical vapour deposition at atmospheric pressure, using diethylzinc as zinc precursor and water as oxydizer. A deposition temperature of 200° C. was chosen. The zinc oxide layers obtained in this way, viz. the undoped zinc oxide layers, were very poor conductive. The resistance was higher than 100 Ohm/sq.

Some of the zinc oxide layers where subsequently coated at a temperature of 200° C. with an aluminium oxide ($Al_2O_3$) layer having a thickness of 60 nm, by using a spatial Atomic Layer Deposition technique. Trimethylaluminium was used as aluminium precursor and water as oxydizer. The multilayer of glass, zinc oxide, and aluminium oxide was exposed during 5 (five) minutes in air at room temperature to an iron lamp with a power of 100 W/cm². The iron lamp provided UV radiation mainly with a wavelength between about 250 nm and about 600 nm, a wavelength for which aluminium oxide having a band gap of about 9 eV, is transparent. The distance between the UV source and the multilayer with the aluminium oxide facing the UV source, was chosen to equal 20 cm. It is observed that for such zinc oxide layers the optimum UV exposure time is about ten minutes in this specific experimental set-up. However, other experiments revealed that the optimum UV exposure time can be shorter or longer.

Multilayers of glass, zinc oxide, and aluminium oxide as well as zinc oxide layers deposited on glass, viz. without the barrier layer, are exposed to the UV radiation simultaneously. The exposure to the UV radiation reduces the electrical resistance of the zinc oxide layers to values lower than 100 Ohm/sq. More in particular, after 5 minutes (300 sec) of UV exposure, both the multilayer of glass, zinc oxide, and aluminium oxide as well as the zinc oxide layers deposited on glass had a low electrical resistance of about 20 Ohm/sq as can been seen in FIG. 6. Further experiments revealed that the conductivity of the zinc oxide could even be further improved up to a square resistance of only 15 Ohm/sq after UV exposure.

Analysis of the zinc oxide layer revealed that the carrier density in the zinc oxide can typically be increased with more than a factor of two by the UV irradiation, resulting in carrier densities in the order of $10^{20}$ cm$^{-3}$ or higher. At the same time the mobility of the carriers can be increased by typically a factor of four or more, resulting in a carrier mobility in the order of 40 cm$^2$/Vs or higher.

The resistance of zinc oxide layers not covered with the aluminium barrier sharply increased when the UV source was switched off. The resistance of the zinc oxide layer covered with the aluminium oxide appeared to be more stable. No measurable reduction of the conductivity was observed for at least 3,000 hours.

Further experiments revealed that similar results can be obtained with other dielectrics than aluminium oxide, like glass which absorbs radiation with a wavelength typically below 250 nm, and polyethylene terephthalate (PET) which absorbs wavelength typically below 280 nm.

Figure 6:
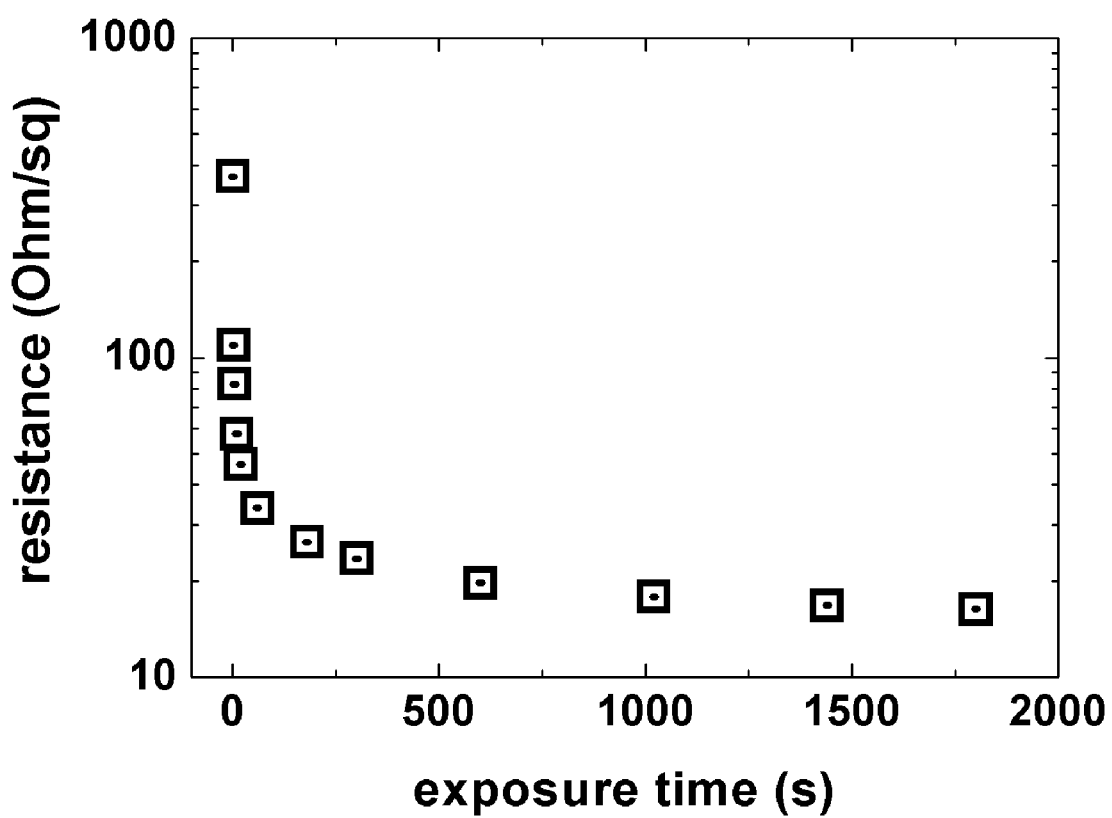
FIG. 6 square resistance of a ZnO layer as a function of the UV exposure time.
Figure 7:
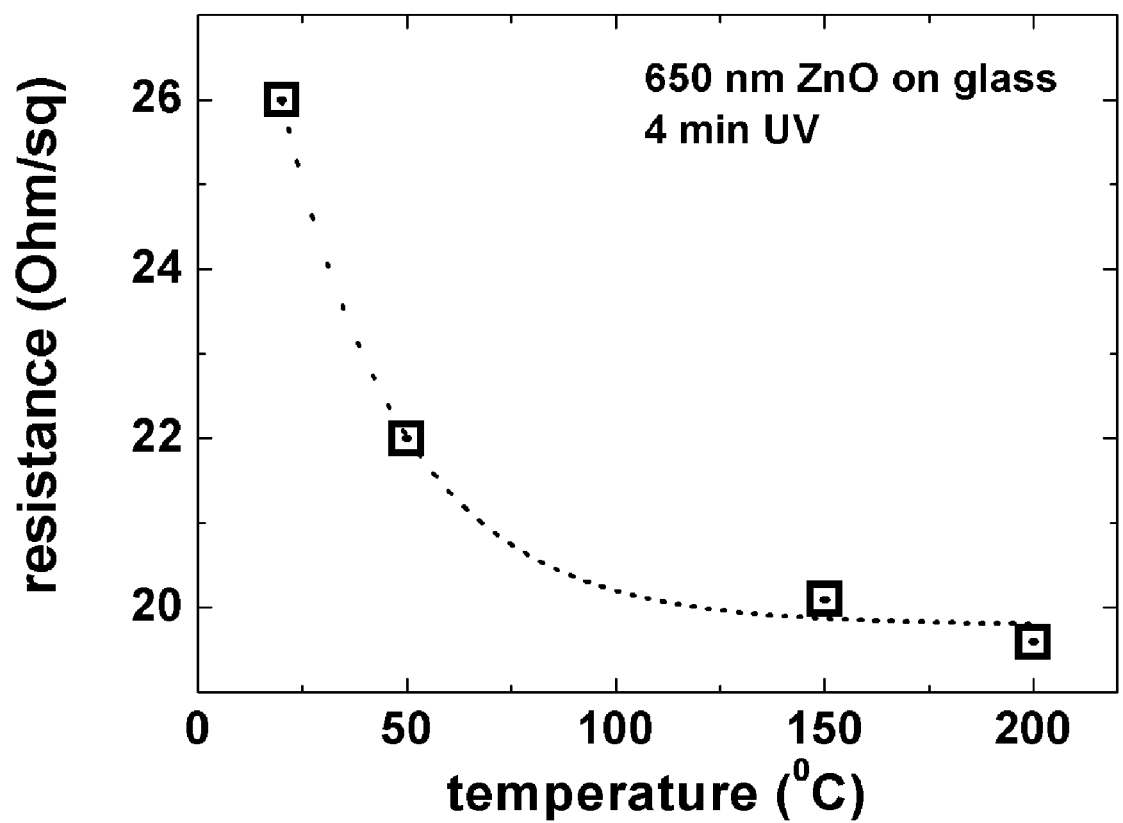
FIG. 7 square resistance of a ZnO layer as a function of the heating temperature during UV irradiation.

FIG. 6 clearly reveals that the square resistance of the ZnO layer depends on the period during which the layer is exposed to the UV light. Another parameter that improves the conductivity of the layer is the temperature of the ZnO layer during providing the UV radiation. As an example, a 650 nm thick layer of ZnO was heated at temperatures of 20° C., 50° C., 150° C. and 200° C., each during 4 minutes. In FIG. 7, the square resistance as measured at room temperature is shown. These experimental results reveal that the electrical resistivity of the metal oxide layer can be further reduced, the amount of reduction depending on the temperature.

Figure 8:
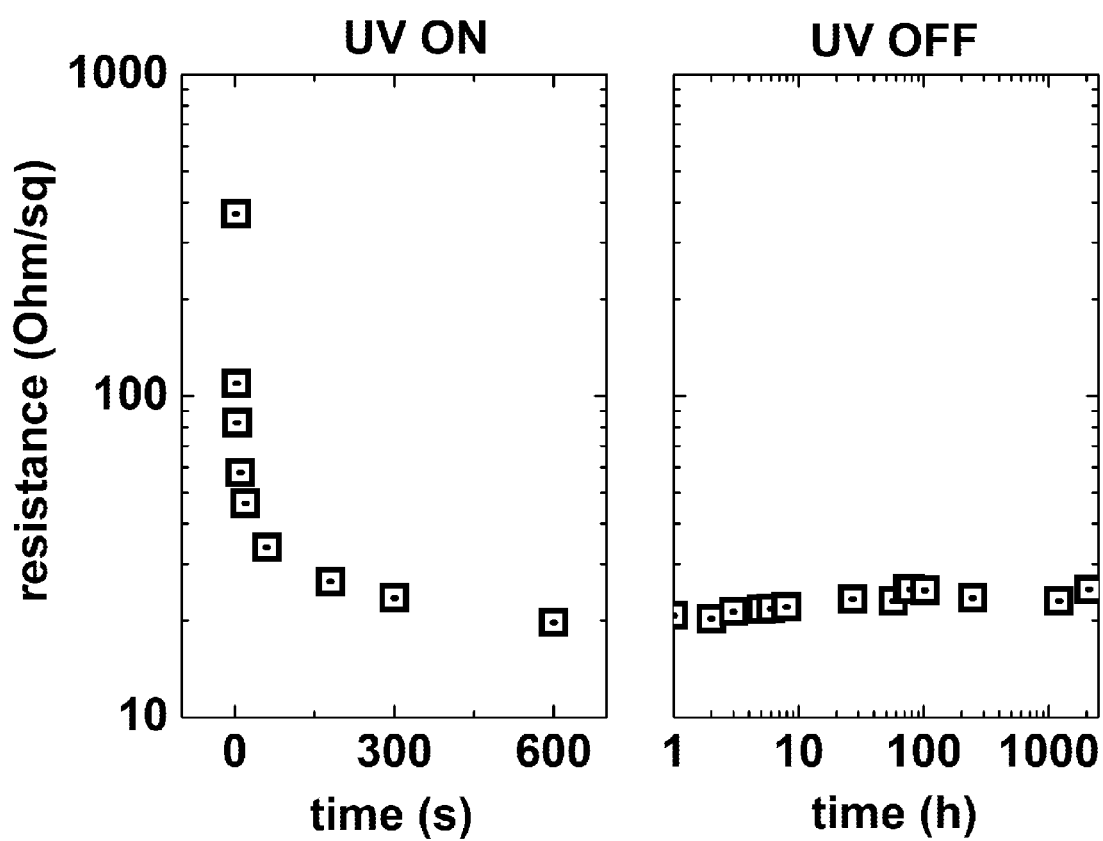
FIG. 8 square resistance of a ZnO layer as a function of time during and after UV irradiation.

FIG. 8 illustrates that the good conductivity is maintained also after the UV light has been switched of. In this example the ZnO layer was exposed to UV light during 10 minutes. The improvement of the conductivity, viz. the reduction of the square resistance as a function of time is shown in the graph at the left hand side of the figure. After switching of the UV light, the square resistance was measured during 100 days. The graph at the right hand side shows that the good conductivity is maintained during this time period.

The invention claimed is:

1. Method of manufacturing a device having a transparent metal oxide electrode, the method comprising the steps of
providing a transparent metal oxide,
applying a substantially UV transparent barrier layer on the transparent metal oxide,
irradiating the transparent metal oxide with UV radiation, wherein the barrier layer is applied before irradiating the transparent metal oxide, such that the UV radiation is provided to the transparent metal oxide through the UV transparent barrier layer before completing manufacture of the device.

2. Method according to claim 1 comprising the step of depositing the transparent metal oxide on a carrier layer.

3. Method according to claim 2 wherein the transparent metal oxide is deposited on a carrier layer before applying the barrier layer on the transparent metal oxide.

4. Method according to claim 1, wherein the transparent metal oxide comprises zinc oxide.

5. Method according to claim 1 wherein the transparent metal oxide has a square resistance of at least 100 Ohm/sq before the irradiation and wherein the step of irradiating the transparent metal oxide with UV radiation is performed irradiating the metal oxide by means UV irradiation from a UV source for a duration that, under the conditions of the irradiation, decreases the square resistance of the transparent metal oxide to below 100 Ohm/sq.

6. Method according to claim 1, wherein the transparent metal oxide is irradiated with UV radiation during ten minutes or less.

7. Method according to claim 4, wherein the transparent metal oxide is heated during providing the UV radiation up to a temperature higher than room temperature.

8. Method according to claim 1, wherein the UV transparent barrier layer comprises aluminium oxide.

9. Method according to claim 4, wherein zinc oxide is deposited by Plasma Enhanced Chemical Vapour Deposition on the carrier layer.

10. Method according to claim 7 wherein the barrier layer is deposited by spatial Atomic Layer Deposition on the transparent metal oxide.

11. Method according to claim 1, wherein the device is photovoltaic cell of the CIGS type, the transparent metal oxide electrode being a zinc oxide electrode, the method further comprising the step of providing a buffer layer between the barrier layer and the transparent metal oxide.

12. Method according to claim 4, wherein step of irradiating the transparent metal oxide with UV radiation is performed by irradiating the transparent metal oxide from a UV source for a duration so that the carrier density of the zinc oxide is increased to $1\times10^{20}$ cm$^{-3}$ or higher after the irradiation.

13. Method according to claim 4, wherein the step of irradiating the transparent metal oxide with UV radiation is performed by irradiating the transparent metal oxide from a UV source for a duration that increases the carrier density the carrier mobility of the zinc oxide to 40 cm$^2$/Vs or higher after the irradiation.

14. Method according to claim 1, comprising providing a top electrical contact on a part of the transparent metal oxide, extending through the barrier layer to provide external electrical contact.

15. Method according to claim 1, comprising providing a top electrical contact on a part of the transparent metal oxide, the barrier layer covering the top electrical contact.

16. Method according to claim 5 wherein the step of irradiating the transparent metal oxide with UV radiation is performed irradiating the metal oxide by means UV irradiation from a UV source for a duration that, under the conditions of the irradiation, decreases the square resistance of the transparent metal oxide to below 20 Ohm/sq.

17. Method according to claim 1, wherein the device is a photovoltaic cell.

18. Method of making a transparent metal oxide electrode, the method comprising the steps of
providing a transparent metal oxide,
applying a substantially UV transparent barrier layer comprising aluminum oxide on the transparent metal oxide,
irradiating the transparent metal oxide with UV radiation, wherein the barrier layer is applied before irradiating the transparent metal oxide, such that the UV radiation is provided to the transparent metal oxide through the UV transparent barrier layer.

19. Method of making a photovoltaic cell of the CIGS type comprising a zinc oxide electrode the method comprising making the zinc oxide electrode by
providing a transparent zinc oxide layer,
providing a buffer layer on the zinc oxide layer
applying a substantially UV transparent barrier layer oxide on the transparent zinc oxide,
irradiating the transparent zinc oxide with UV radiation, wherein the barrier layer is applied before irradiating the transparent zinc oxide, such that the UV radiation is provided to the transparent zinc oxide through the UV transparent barrier layer and the buffer layer.

* * * * *